US006312281B1

(12) United States Patent
Rodriguez

(10) Patent No.: US 6,312,281 B1
(45) Date of Patent: Nov. 6, 2001

(54) TAP CONNECTOR

(75) Inventor: Samuel Rodriguez, Chicago, IL (US)

(73) Assignee: Andrew Corporation, Addison, IL (US)

( * ) Notice: Subject to any disclaimer, the term of this patent is extended or adjusted under 35 U.S.C. 154(b) by 0 days.

(21) Appl. No.: 09/756,623

(22) Filed: Jan. 8, 2001

(51) Int. Cl.[7] ............................ H01R 11/20; H01R 4/24; H01R 9/05; H01R 12/00; H05K 1/00

(52) U.S. Cl. ........................ 439/394; 439/578; 439/76.1; 439/98; 439/425

(58) Field of Search .................................. 439/394, 578, 439/76.1, 98, 418, 425, 100

(56) References Cited

U.S. PATENT DOCUMENTS

| | | | | |
|---|---|---|---|---|
| 1,675,163 | * | 6/1928 | Colburn . | |
| 3,602,872 | * | 8/1971 | Braunstein et al. | 339/97 |
| 4,365,859 | * | 12/1982 | Hutter et al. | 339/97 |
| 4,374,605 | * | 2/1983 | Bratt | 339/143 |
| 4,738,009 | * | 4/1988 | Down et al. | 29/33 |
| 4,795,356 | * | 1/1989 | Pauza | 439/225 |
| 5,116,224 | * | 5/1992 | Cartier | 439/578 |
| 5,482,475 | * | 1/1996 | Kawagashi | 439/394 |
| 5,494,454 | * | 2/1996 | Johnsen | 439/394 |
| 5,846,099 | * | 12/1998 | Hiruma et al. | 439/620 |
| 6,116,943 | * | 9/2000 | Ferrill et al. | 439/418 |
| 6,135,806 | * | 10/2000 | Pohjola | 439/425 |

OTHER PUBLICATIONS

Andrew Corporation Catalog, No. 37, 1997, p. 725.

* cited by examiner

*Primary Examiner*—Paula Bradley
*Assistant Examiner*—Edwin A. León
(74) *Attorney, Agent, or Firm*—Vedder, Price, Kaufman & Kammholz

(57) ABSTRACT

An improved connector for diverting signals from a first cable to a second cable including a housing having a base, a cover attached to the base, and a passageway defined by the base and cover. The base includes a channel which engages an outer cover of said first cable, a receptacle, and a device to attach the base to the first cable. The channel includes a boss which has a longitudinally extending bore which is in communication with the receptacle. The base includes a lower part of the passageway. The receptacle is defined by a substantially circumferential wall. A printed circuit board is disposed within the receptacle. A contact pin extends through an aperture in the printed circuit board and the bore, and contacts a conductor of the first cable for electrical communication between the first and cond cables. The cover includes an upper part of the passageway and a pocket which is defined by a substantially circumferential wall. Operative association of the base and cover cooperatively define the passageway to receive and retain the second cable.

20 Claims, 3 Drawing Sheets

FIG. 3
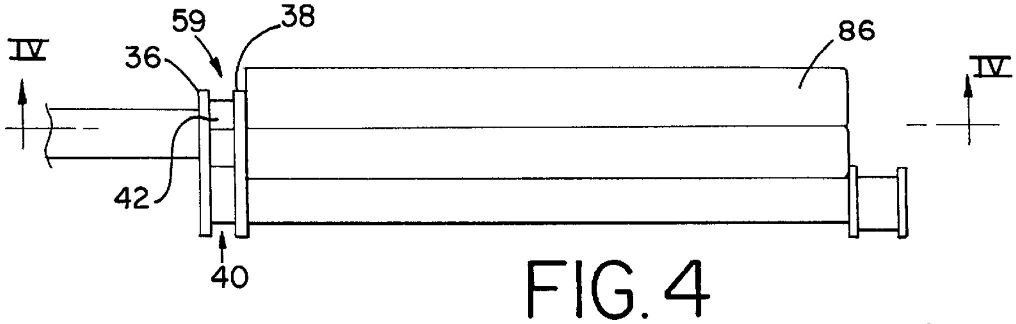
FIG. 4
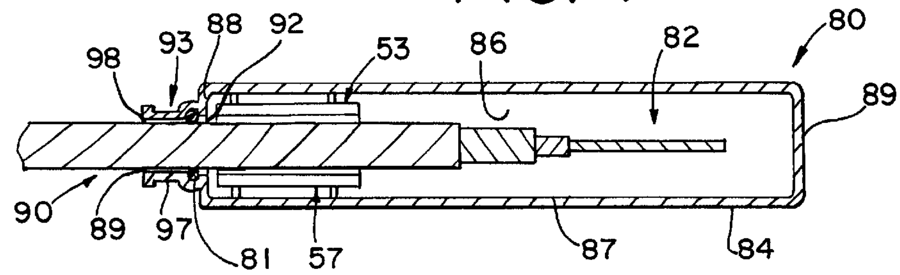
FIG. 5
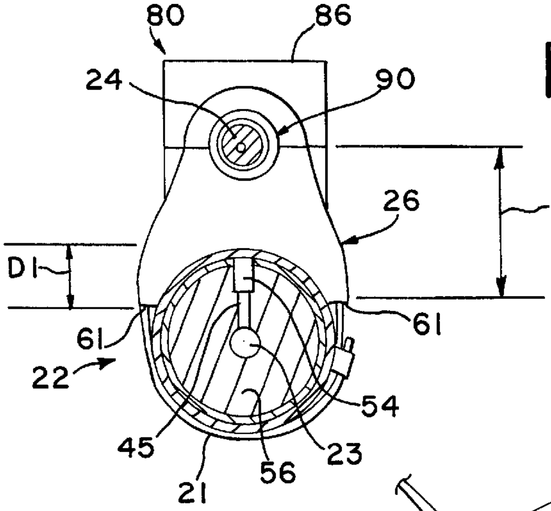
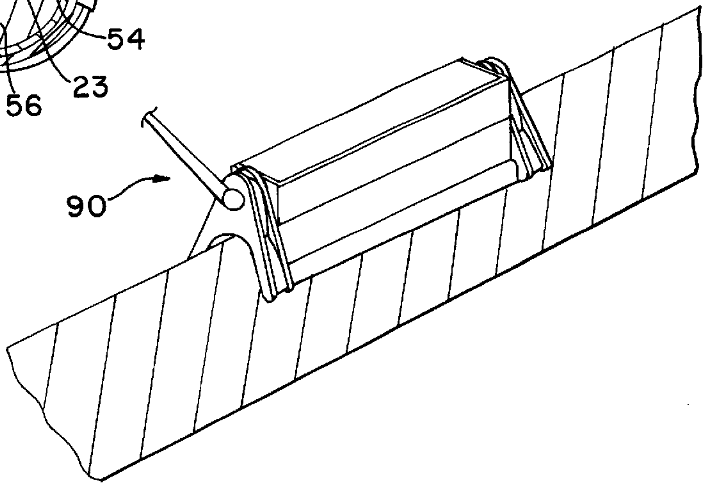
FIG. 6

TAP CONNECTOR

BACKGROUND OF THE INVENTION

The present invention relates to connectors, and more particularly, to a cable tap connector which diverts signals from one cable to another cable. The tap connector is compact, less expensive to manufacture, provides enhanced tuning and is easier to install.

A conventional cable tap connector, illustrated in FIGS. 7 and 8, is large, bulky, difficult to install, and space consuming. The connector includes two parts. A first part 300 functions as a mounting saddle. Generally, the first part has a flat bottom for connection with a desired surface S, and a top with a channel 302 for receiving the coaxial cable C. The second part 304 is essentially a reverse mirror image of the first part aside from the integral connector 306 mounted on the top surface. The first and second parts are connected by threaded fasteners 308.

One major disadvantage of this prior art design is the size of the unit and difficulty of installation. In order to install the prior art tap connector, the cable must be pulled away from the mounting surface, FIG. 8, to fit the first part under the cable. Usually the cable must be entirely disconnected in order to mount the first part.

This consumes a large amount of installation time, thereby increasing costs. Occasionally, even if the cable is entirely disconnected, the tap connector cannot be installed because the installer will not be able to reattach the cable end connectors where necessary because the cable is too short with the tap installed. A cable would have to be installed and this is clearly problematic.

Another major disadvantage of the prior art tap connector is the integrated connector on the top surface, FIGS. 7 and 8. These tap connectors are most commonly installed in cable trunking or other narrow, space-limited confines such as a plenum or elevator shaft, FIG. 8. The integrated connector of the prior art extends perpendicular to the longitudinal axis of the cable. The second cable must therefore also be connected in a perpendicular orientation unless the installer uses a more expensive ninety-degree fitting. Further, in order to maintain maximum performance, the second cable can only bend to the minimum bend radius $R_m$ limit. Accordingly, the prior art tap connector requires a significant amount of room perpendicular to the cable in order to properly turn the second cable to run parallel to the first cable.

Thus, there remains a need for a cable tap connector which has a compact, space-saving, low-profile, one-side attachment, convenient installation, minimal materials, and flexible entrance/exit design.

SUMMARY OF THE INVENTION

In order to accomplish the objects of the present invention, a cable tap connector according to the present invention comprises a base, a cover and a passageway. The base is adapted to engage the outer covering of a first coaxial cable such that a contact pin may engage the conductor of the first cable. Accordingly, the signals are diverted to a second cable which extends through a passageway defined by cooperative association of the base and the cover.

It is therefore a general object of the present invention to provide a new cable tap connector that can be installed in situ without disturbing the first cable.

It is another object of the present invention to provide a new tap connector having a compact, minimum perpendicular height profile.

It is yet another object of the present invention to provide a new tap connector which significantly reduces materials and costs.

It is still another object of the present invention to provide a new tap connector with the second cable passageway parallel to the longitudinal axis of the first cable.

It is yet another object of the present invention to provide a new tap connector with second cable passageway defined by a operative connection of the base and cover.

It is still yet another object of the present invention to provide a new tap connector having unitary construction so that the connector only engages one side of the first cable and the other side of the first cable remains in its originally routed position, usually against a wall.

In a principal aspect of the present invention, the preferred embodiment is defined by a housing having a base, a cover, and a second cable. The base has an arcuate lower surface and a receptacle disposed on an upper surface. The lower surface has a boss extending into a channel. A bore extends through the boss into the receptacle. An exterior wall defines the receptacle which has a first part and a second part separated by a groove transverse to the longitudinal axis of the housing. A printed circuit board and contact pin are disposed within the first part. The cover includes a pocket defined by an exterior wall and has a first part and a second part separated by a groove. The base second part and the cover second part cooperatively define the passageway for the second coaxial cable. An annular resilient element connected to the second coaxial cable is received in the groove formed by cooperative association of the base and cover. A ground shield of the second cable may be attached to the printed circuit board and a conductor of the second cable is attached to the contact pin. The cover is attached to the base defining a volume including the receptacle and pocket which are sealed from exterior elements.

In another principal aspect of the present invention, another embodiment is defined by a housing having a base, a cover attached to the base, and a passageway cooperatively defined by the base and cover. The base includes a recess adapted to engage an outer covering of the first cable, a receptacle, a lower part of the passageway and means for attaching the base to the first cable. The channel includes a boss formed on a lower surface. The boss has a longitudinally-extending bore which is in communication with the receptacle. A substantially circumferential wall defines the receptacle and has a printed circuit board disposed therein. A contact pin extends through an aperture in the printed circuit board and the bore. The cover includes an upper part of the passageway and a pocket defined by a circumferential wall. Operative association between the base and cover cooperatively define the passageway in order to receive and retain the second cable.

These and other features, objects and advantages of the present invention will become more apparent from the detailed description set forth below when taken in conjunction with the drawings in which like reference numerals identify like elements throughout.

BRIEF DESCRIPTION OF THE DRAWINGS

In the course of the following detailed description, reference will be made to the attached drawings in which:

FIG. 3 is a side elevation view of the connector of FIG. 1;

FIG. 4 is a cross-sectional view of the connector of FIG. 3 taken along lines IV—IV thereof;

FIG. 5 is a cross-sectional view of the connector of FIG. 1 taken along lines V—V thereof;

FIG. 6 is a perspective view of an alternative embodiment of the connector constructed in accordance with the principles of the present invention;

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of the embodiment of the invention. The scope of the invention is best defined by the appended claims.

Figure 1:
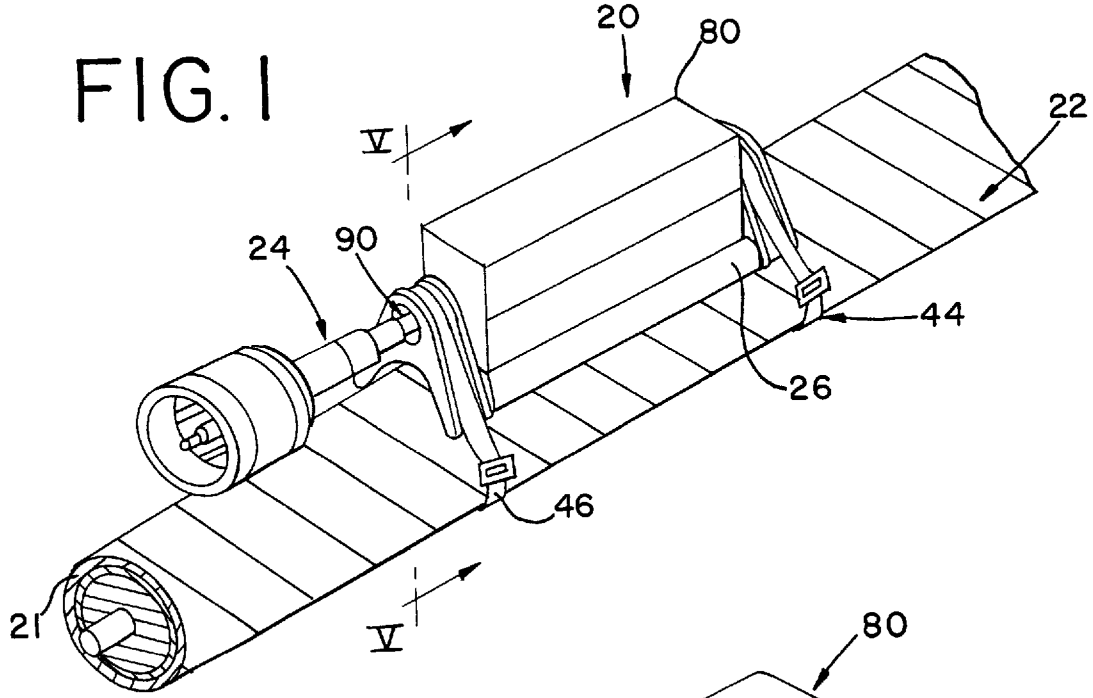
FIG. 1 is perspective view of an improved coaxial cable tap connector constructed in accordance with the principles of the present invention mounted on a first coaxial cable.

Referring now to FIG. 1, a cable tap connector constructed in accordance with the principles of the present invention is generally designated as 20. The connector 20 is a low-profile or reduced-height tap for diverting signals within a predetermined frequency band from a first cable 22 to a second cable 24. The first cable 22 has an arcuately shaped outer cover configuration.

The connector assembly 20, as shown in FIGS. 1 and 5, is installed on the first cable 22 as an integral one-piece unit having operatively associated a base 26, cover 80, passageway 90 and second cable 24. The base 26 has a lower surface 28 which is generally recessed as viewed from one the ends 27 or 29. An upper surface 30 generally mirrors the contour of the lower surface 28 and has a receptacle 32, lower part 91 of the passageway 90, and securing apparatus 34 formed thereon. The lower surface 28 and ends 61 define a channel or recess 39 having a depth D1 which is adapted to complimentarily engage the outer cover 21 of the first cable 22. The diametrical size of the first cable 22 is defined within a certain range. The depth D1 also differs depending on the size of the first cable 22, as will be recognized by those of ordinary skill in the art. Accordingly, the depth D1 has a range of values dependent on the size of the first cable 22.

The outer cover 21 is generally a plastic or other synthetic, dielectric material and preferably has an arcuately shaped outer configuration. An attachment device 50 is disposed on a substantial portion of the lower surface 28. Preferably, the attachment device 50 is an adhesive such as double-sided foam tape; however, it will be understood by one of skill in the art that any other form of like adhesive, applied by spray or brush, will achieve desirable results.

A boss 54 extends from the lower surface 28 into the channel 39 an amount less than the depth D1. The boss 54 is may be either integrally formed with the lower surface 28, or as a separate element and attached to the lower surface 28. In use, illustrated in FIG. 5, the boss 54 projects through an aperture formed in the outer cover 21, ground conductor 23, and dielectric 56 of the first cable 22. A bore 58 is formed in the boss 54 extending along its longitudinal axis and in communication with the receptacle 32. The bore 58 terminates in the receptacle 32 at an aperture 60 formed in the floor 62.

A securing apparatus 34 is disposed at the front 27 and rear 29 of the base 26. Preferably, each apparatus 34 includes an outer rib 36, an inner rib 38, and a floor 42, which cooperatively define a channel 40. The floor 42 of the rear apparatus 35 is substantially coplanar with the upper surface 30. Each channel 40 may receive an elongated strap 46 of a locking band 44 in order to provide further positive connection of the connector 20 to the first cable 22. A segment 59 of the channel 40 of the front apparatus 37 is formed on the cover 80 as will be discussed in more detail below.

Figure 2:
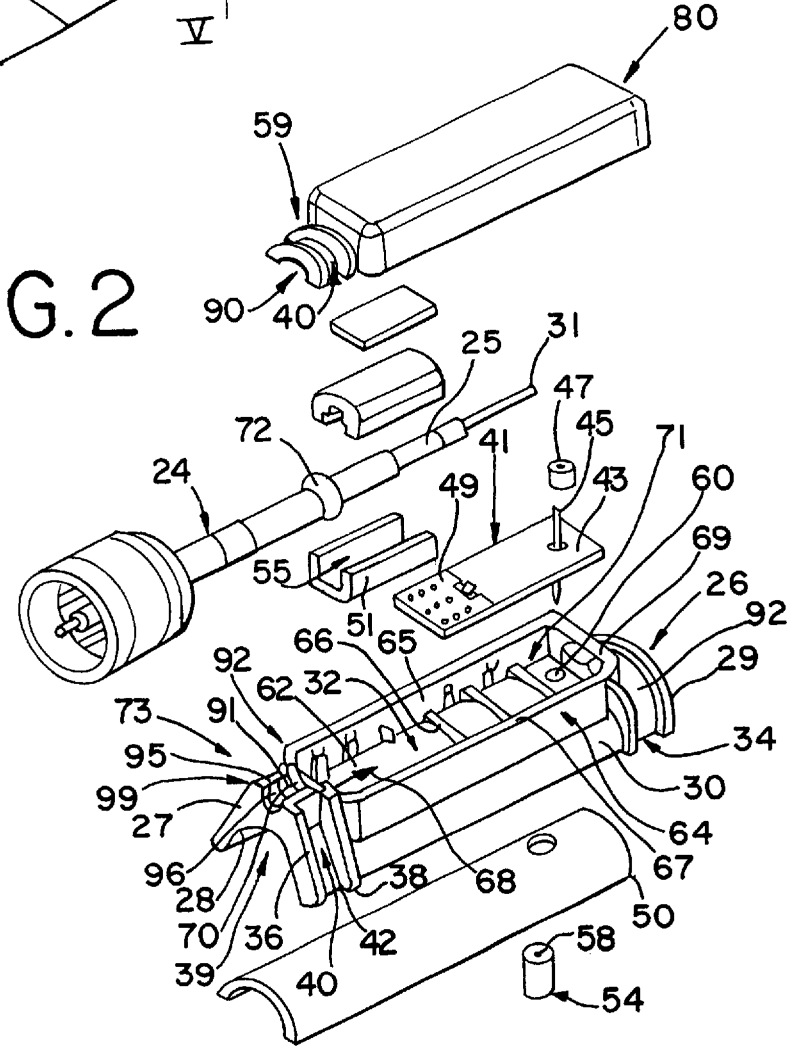
FIG. 2 is an exploded perspective view of the connector shown in FIG. 1.

The receptacle 32, as shown in FIG. 2, is defined on the upper surface 30 of the connector 20 by a circumferentially extending wall 64. A first part 71 of the receptacle 32 is defined by an inner surface 65 and floor 62. Preferably, the first part 71 includes a pair of parallel longitudinal sides 67, and a front wall end 68 and a rear wall end 69. A plurality of ribs and other support elements 66 are preferably integrally formed in the first part 71 to provide reinforcement and support for items disposed in the receptacle 32 as will be recognized by one of skill in the art and discussed below.

The second part 73 of the receptacle 32 includes a lower portion 91 of the passageway 90 which extends from a first end 92 adjacent the front wall and 68 to a second end 99 adjacent the outer rib 36 of the front apparatus 37 preferably along the longitudinal axis of the base 26. The lower portion 91 is defined by a pair of substantially parallel longitudinal walls 95 and a floor 96 interconnecting the walls 95. A groove 70 is formed in the floor 96 of the lower portion 91 at the first end 92 adjacent front wall end 68. The groove 70 is generally aligned with the inner rib 38 of the front apparatus 37 in order to receive a resilient member 72. The lower portion 91 is dimensioned to receive a portion of the second cable 24.

A printed circuit board 41 is disposed within the first part 71 of the receptacle 32 adjacent the rear wall end 69. A contact pin assembly 145 is secured by conventional means to the printed circuit board 41 adjacent the rear wall end 69. The sheath 146 of the assembly 145 is preferably soldered to the printed circuit board 41 about an aperture 43. A contact pin 45 extends through the sheath 146 and preferably has a desired range of vertical movement. The aperture 43 is formed in the printed circuit board 41 so that the contact pin 45 may also extend through the aperture 60 and bore 58. The contact pin 45 may have an ferrite collar 47 for signal tuning purposes as will be recognized by one of skill in the art. The ferrite collar 47 is disposed on the top surface of the printed circuit board 41 around the aperture 43. The first conductor 31 of the second cable is connected to the contact pin 45. A solder pad 49 is disposed on an end of the printed circuit board 41 away from the aperture 43 for connection with the second conductor 25 of the second cable 24. Additional electrically conductive traces (not shown) on the printed circuit board 41 provide the desired signal tuning levels as will be recognized by one of ordinary skill in the art.

A ferrite block lower portion 51 is also disposed within the receptacle 32 adjacent the front wall end 68. A channel 55 formed in the ferrite block 51 to receive a portion of the second cable 24 and provides a signal tuning effect therefor as is well recognized by one of ordinary skill in the art. The ferrite block lower portion 51 is secured in the receptacle 32 by any available conventional means, preferably, the lower portion 51 is snap fittingly secured to the receptacle 32, however, an adhesive such as double sided tape, glue or any other may be used to provide positive positioning.

The cover 80, as shown in FIG. 4, includes a pocket 82 and an upper portion 93 of the passageway 90. The pocket 82 is defined by a circumferentially extending wall 84 and a roof 86. The wall 84 preferably includes a pair of parallel, longitudinal extend sides 87, a front wall end 88, and a rear wall end 89. The roof 86 interconnects the sides 87 and ends 88 and 89, so that, when the cover 80 is positioned over the base 26 the walls 64 and 84 are in substantially continuous contact about their perimeters. An upper portion 93 of the passageway 90 is defined by a pair of longitudinal, generally parallel walls 97 and a roof 98. The upper portion 93 extends from a first end 92 adjacent the front wall end 88 to a second end 89 adjacent the outer rib 36 of the front apparatus 37 generally along the longitudinal axis of the cover 80. A groove 81 is formed in the roof 98 of the upper portion 93 adjacent the front wall end 88. The groove 81 is generally aligned with the inner rib 38 of the front apparatus 37 in order to receive a resilient member 72 The upper portion 93 is dimensioned to receive a portion of the second cable 24.

Figure 7:
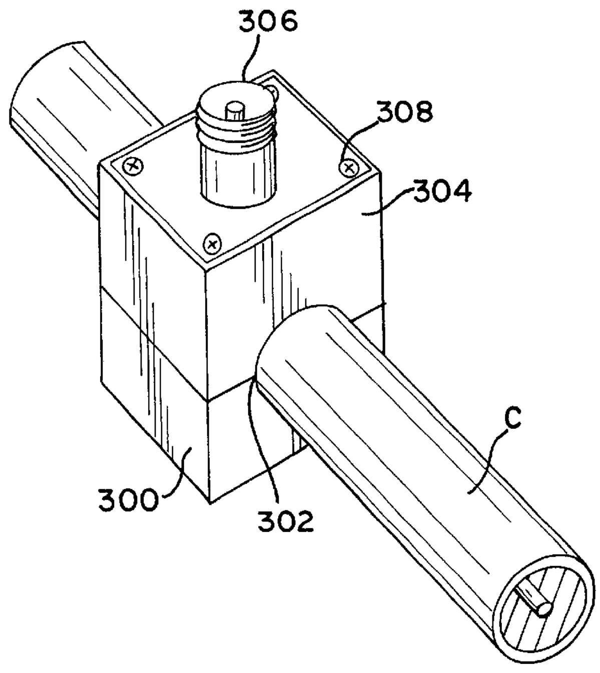
FIG. 7 PRIOR ART
FIG. 7 is a perspective view of a prior art tap connector.
Figure 8:
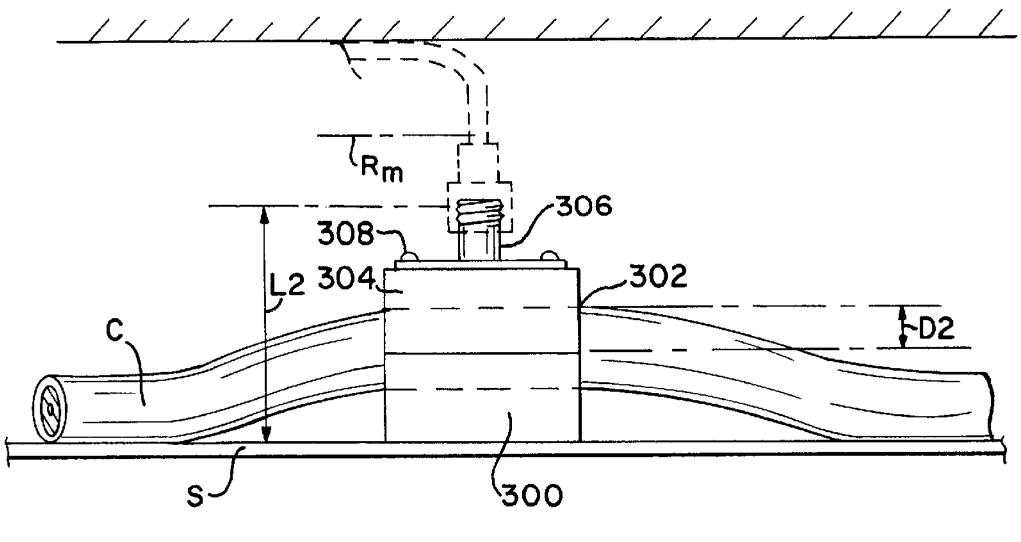
FIG. 8 PRIOR ART
FIG. 8 is a side elevation view of the prior art tap connector of FIG. 7 installed in a confined space.

When the cover 80 is operatively associated with the base 26 the grooves 70 and 81 cooperatively define an annular groove which receives the resilient member 72 with slight interference. The cover 80 is then preferably ultrasonically welded to the base 26 in order to hermetically seal the receptacle 32 and pocket 82 combination. An overall height H of the assembled connector is measured from the ends 61 to the exterior surface of the roof 86. The height H remains constant regardless of the size of the first cable 22. This illustrates the compact, reduced-height design of the present invention. Accordingly, the longitudinal axis of the passageway 90 is disposed at a location L1, no more than 2.3 times the depth D1, from the ends 61. Whereas, the prior art device 300 shown in FIGS. 7 and 8, has a connector 306 for connection to a second cable disposed at a location L2 at least 4 times the depth D2. It will be obvious to those of ordinary skill in the art that the present invention provides a significant reduction in the height H of the connector 20 and the distance of the second cable 24 from the surface S.

As briefly mentioned above, a segment 59 of the front apparatus 37 is formed on the cover 80. The structural components, namely ribs 36, 38, and floor 42, are substantially the same. The channel 40 is a continuation of the channel 40 formed on the base 26 such that the strap 46 has a smooth transition form one side of the base 26 to the other.

A ferrite block upper portion 53 is disposed within the pocket 82 adjacent the front wall end 88. A channel 57 formed in the ferrite block upper portion 53 to receive a portion of the second cable 24 and provide a signal tuning effect as is well recognized by one of ordinary skill in the art. The ferrite block upper portion 53 is secured in the pocket 82 by any available conventional means, preferably double-sided tape or another adhesive or glue.

The passageway 90 is defined by the cooperative association of the respective lower 91 and upper 93 portions of the base 26 and cover 80. During assembly, the second cable 24 is connected as discussed above and positioned in the lower portion 91. The cover 80 and upper portion 93 are connected to the base 26. The upper portion 93 receives a portion of the second cable 24. Preferably, the second cable 24 enters/exits the passageway 90 of the connector 20 along the substantially parallel to the longitudinal axis of the first cable 22. This structural configuration greatly enhances the low-profile nature of the connector 20 by permitting the second cable 24 to exit parallel to the first cable 22 as close to the first cable 22 as permissible. The bulk or minimum perpendicular clearance height of the connector 20, is considerably reduced over the prior art.

Turning now to FIG. 6, an alternative embodiment of the present invention is shown. The structure is substantially the same as previously discussed, and is advantageous over the above when a passageway 90 oriented oblique to the longitudinal axis of the first cable 22 is necessary. The lower 91 and upper 93 portions which cooperatively define the passageway 90 which may be oriented at any angle to the longitudinal axis of the first cable 22 as required.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The actual scope of the invention is intended to be defined in the following claims when viewed in their proper perspective based on the prior art.

I claim:

1. A connector for diverting signals from a first cable to a second cable, comprising:

a housing having a base, a cover attached to said base and a passageway defined by cooperative association of said base and said cover;

said base including a channel adapted to engage an outer cover of said first cable, a receptacle, a lower part of said passageway, and means for attaching said base to said first cable;

said channel including a boss extending from a lower surface;

said boss including a bore extending along a longitudinal axis of said boss and in communication with said receptacle;

said receptacle defined by a substantially circumferential wall and includes a printed circuit board adapted for connection to a ground shield of a second cable;

a contact pin extending through an aperture in said printed circuit board and said bore, and adapted for communication at a first end to a conductor of said second cable and to contact a conductor of said first cable at a second end so that electrical communication is provided between said first cable and said second cable; and said cover and a pocket defined by a substantially circumferential wall for contact with said receptacle wall including an upper part of said passageway, whereby operative association between said base and cover cooperatively define said passageway such that said second cable is disposed and retained therein.

2. The connector as recited in claim 1, further including a tuning collar disposed about said contact pin.

3. The connector as recited in claim 1, wherein said means for attaching includes a locking band engaging said housing and said first coaxial cable.

4. The connector as recited in claim 1, wherein said means for attaching includes at least one channel formed in said housing for engaging a locking band encircling said first coaxial cable and said channel.

5. The connector as recited in claim 1, wherein said passageway has a longitudinal axis parallel to a longitudinal axis of said first cable.

6. The connector as recited in claim 1, wherein said passageway has a longitudinal axis oblique to a longitudinal axis of said first cable.

7. The connector as recited in claim 1, wherein said passageway has a first end longitudinally aligned with a second end.

8. The connector as recited in claim 1, wherein said passageway has a first end oblique to a second end.

9. The connector as recited in claim 1, wherein said means for attaching includes an adhesive disposed within said channel.

10. The connector as received in claim 9, wherein said adhesive material includes double-sided tape.

11. The connector as recited in claim 1, further including a groove formed at a second end of said passageway which is adapted to receive a resilient member formed on said second cable.

12. The connector as recited in claim 11, wherein said groove is disposed adjacent a front wall end of said receptacle.

13. The connector as recited in claim 1, further including a tuning block disposed about said second cable having a lower part and an upper part, wherein said lower part is disposed in said receptacle and said upper part is disposed in said pocket.

14. The connector as recited in claim 13, wherein said tuning block is disposed adjacent second end of said passageway.

15. A low-profile junction for tapping a signal from a first cable and providing electrical communication with a device responsive to said signal, comprising:

a housing and a second cable;

said housing including a base and a cover;

said base including a recess defined by a lower surface and ends, and a receptacle;

said recess having a depth, and adapted to complimentarily engage the first cable;

said lower surface having a boss extending into said recess;

said boss including a bore extending along a longitudinal axis of said boss and in communication with said receptacle;

said receptacle formed on an upper surface of said base and defined by a wall;

a contact pin extending through the bore in the boss, connected at a first end to the second cable and adapted to contact a conductor of the first cable at a second end, such that the first and second cables are in communication;

said receptacle including a first part and a second part separated by a groove;

said cover including a pocket defined by a wall and including a first part and a second part separated by a groove; and said base second part and said cover second part operatively associated to cooperatively define a passageway for said second cable parallel to a longitudinal axis of said first cable at a location from said ends less than thrice said depth.

16. The junction as recited in claim 15, wherein said passageway has a longitudinal axis parallel to a longitudinal axis of said housing.

17. The junction as recited in claim 15, wherein said passageway has a longitudinal axis oblique to a longitudinal axis of said housing.

18. The junction as recited in claim 15, wherein said lower surface has an adhesive for attaching said junction to the first cable.

19. The junction as recited in claim 15, wherein said second cable includes an annular resilient element which is operatively associated with said base and cover grooves in order to seal a volume defined by the operative association of said base and cover first parts.

20. The junction as recited in claim 15, wherein said housing further includes at least one securing apparatus for further positive attachment of said junction to the first cable.

* * * * *